United States Patent
Kojima et al.

(10) Patent No.: US 9,175,404 B2
(45) Date of Patent: Nov. 3, 2015

(54) ETCHING AGENT FOR COPPER OR COPPER ALLOY

(71) Applicant: ADVANCED TECHNOLOGY MATERIALS, INC., Danbury, CT (US)

(72) Inventors: Tsutomu Kojima, Kyoto (JP); Yukichi Koji, Shiga-ken (JP)

(73) Assignee: ADVANCED TECHNOLOGY MATERIALS, INC., Danbury, CT (US)

( * ) Notice: Subject to any disclaimer, the term of this patent is extended or adjusted under 35 U.S.C. 154(b) by 0 days.

(21) Appl. No.: 14/348,115

(22) PCT Filed: Sep. 28, 2012

(86) PCT No.: PCT/IB2012/003029
§ 371 (c)(1),
(2) Date: Mar. 28, 2014

(87) PCT Pub. No.: WO2013/076587
PCT Pub. Date: May 30, 2013

(65) Prior Publication Data
US 2014/0238953 A1   Aug. 28, 2014

(30) Foreign Application Priority Data

Sep. 30, 2011   (JP) .................................. 2011-215885

(51) Int. Cl.
*C23F 3/00*   (2006.01)
*C23F 1/18*   (2006.01)
(Continued)

(52) U.S. Cl.
CPC ... *C23F 1/18* (2013.01); *C23F 1/34* (2013.01); *C23F 1/44* (2013.01);
(Continued)

(58) Field of Classification Search
CPC ................. C23F 1/18; C23F 1/14; C23F 1/32; C23F 1/34; C23F 1/44; H01L 21/30608; H01L 21/3213
USPC .............. 252/79.1, 79.2, 79.3, 79.4; 438/692, 438/693, 745, 750
See application file for complete search history.

(56) References Cited

U.S. PATENT DOCUMENTS

| | | | |
|---|---|---|---|
| 3,650,957 | A | 3/1972 | Shipley, Jr. et al. |
| 3,650,958 | A | 3/1972 | Shipley, Jr. et al. |

(Continued)

FOREIGN PATENT DOCUMENTS

| | | | |
|---|---|---|---|
| JP | S473409 | Y1 | 2/1972 |
| JP | S4892231 | A | 11/1973 |

(Continued)

OTHER PUBLICATIONS

International Search Report dated Aug. 1, 2013.
(Continued)

*Primary Examiner* — Lan Vinh
(74) *Attorney, Agent, or Firm* — Tristan A. Fuierer; Moore & Van Allen, PLLC; Rosa Yaghmour

(57) ABSTRACT

Object is to provide an etching solution which generates less foam and can etch copper or copper alloy at high selectivity when used in a step of etching copper or copper alloy in an electronic substrate having both of copper or copper alloy and nickel.
The etching solution to be used in a step of selectively etching copper or copper alloy in an electronic substrate having both of copper or copper alloy and nickel has, as essential components thereof, (A) a linear alkanolamine, (B) a chelating agent having an acid group in the molecule thereof, and (C) hydrogen peroxide.

17 Claims, 2 Drawing Sheets

(51) Int. Cl.
  *H01L 21/3213*   (2006.01)
  *C23F 1/34*      (2006.01)
  *C23F 1/44*      (2006.01)
  *H01L 23/00*     (2006.01)
  *H01L 21/768*    (2006.01)
  *H01L 23/48*     (2006.01)

(52) U.S. Cl.
  CPC ......... *H01L 21/32134* (2013.01); *H01L 24/03*
    (2013.01); *H01L 21/76865* (2013.01); *H01L*
    *21/76898* (2013.01); *H01L 23/481* (2013.01);
    *H01L 24/05* (2013.01); *H01L 24/11* (2013.01);
    *H01L 24/13* (2013.01); *H01L 2224/03614*
    (2013.01); *H01L 2224/03826* (2013.01); *H01L*
    *2224/03912* (2013.01); *H01L 2224/0401*
    (2013.01); *H01L 2224/05027* (2013.01); *H01L*
    *2224/05166* (2013.01); *H01L 2224/05572*
    (2013.01); *H01L 2224/05647* (2013.01); *H01L*
    *2224/1146* (2013.01); *H01L 2224/1147*
    (2013.01); *H01L 2224/13009* (2013.01); *H01L*
    *2224/13083* (2013.01); *H01L 2224/13144*
    (2013.01); *H01L 2224/13147* (2013.01); *H01L*
    *2224/13155* (2013.01); *H01L 2924/00014*
    (2013.01); *H01L 2924/1461* (2013.01)

(56) References Cited

U.S. PATENT DOCUMENTS

| | | | |
|---|---|---|---|
| 3,650,959 A | 3/1972 | Shipley, Jr. et al. | |
| 3,992,208 A * | 11/1976 | Nagata et al. | 430/270.1 |
| 5,320,709 A | 6/1994 | Bowden et al. | |
| 5,976,928 A | 11/1999 | Kirlin et al. | |
| 5,993,685 A | 11/1999 | Currie et al. | |
| 6,194,366 B1 | 2/2001 | Naghshineh et al. | |
| 6,211,126 B1 | 4/2001 | Wojtczak et al. | |
| 6,224,785 B1 | 5/2001 | Wojtczak et al. | |
| 6,280,651 B1 | 8/2001 | Wojtczak et al. | |
| 6,306,807 B1 | 10/2001 | Wojtczak et al. | |
| 6,322,600 B1 | 11/2001 | Brewer et al. | |
| 6,323,168 B1 | 11/2001 | Kloffenstein et al. | |
| 6,344,432 B1 | 2/2002 | Wojtczak et al. | |
| 6,346,741 B1 | 2/2002 | Van Buskirk et al. | |
| 6,409,781 B1 | 6/2002 | Wojtczak et al. | |
| 6,426,020 B1 * | 7/2002 | Okada et al. | 252/79.1 |
| 6,492,308 B1 | 12/2002 | Naghshineh et al. | |
| 6,527,819 B2 | 3/2003 | Wojtczak et al. | |
| 6,566,315 B2 | 5/2003 | Wojtczak et al. | |
| 6,599,370 B2 | 7/2003 | Skee | |
| 6,627,587 B2 | 9/2003 | Naghshineh et al. | |
| 6,630,433 B2 | 10/2003 | Zhang et al. | |
| 6,692,546 B2 | 2/2004 | Ma et al. | |
| 6,699,402 B2 | 3/2004 | Russell et al. | |
| 6,723,691 B2 | 4/2004 | Naghshineh et al. | |
| 6,755,989 B2 | 6/2004 | Wojtczak et al. | |
| 6,773,873 B2 | 8/2004 | Seijo et al. | |
| 6,800,218 B2 | 10/2004 | Ma et al. | |
| 6,802,983 B2 | 10/2004 | Mullee et al. | |
| 6,849,200 B2 | 2/2005 | Baum et al. | |
| 6,875,733 B1 | 4/2005 | Wojtczak et al. | |
| 6,896,826 B2 | 5/2005 | Wojtczak et al. | |
| 7,029,373 B2 | 4/2006 | Ma et al. | |
| 7,300,601 B2 | 11/2007 | Liu et al. | |
| 7,335,239 B2 | 2/2008 | Baum | |
| 7,365,045 B2 | 4/2008 | Walker et al. | |
| 7,465,408 B1 | 12/2008 | Avanzino | |
| 7,534,752 B2 | 5/2009 | Wojtczak et al. | |
| 7,736,405 B2 | 6/2010 | Darsillo et al. | |
| 7,888,301 B2 | 2/2011 | Bernhard et al. | |
| 7,922,824 B2 | 4/2011 | Minsek et al. | |
| 7,923,423 B2 | 4/2011 | Walker et al. | |
| 7,960,328 B2 | 6/2011 | Visintin et al. | |
| 7,994,108 B2 | 8/2011 | Minsek et al. | |
| 8,026,200 B2 | 9/2011 | Cooper et al. | |
| 8,058,219 B2 | 11/2011 | Rath et al. | |
| 8,236,485 B2 | 8/2012 | Minsek et al. | |
| 8,304,344 B2 | 11/2012 | Boggs et al. | |
| 8,338,087 B2 | 12/2012 | Rath et al. | |
| 8,367,555 B2 | 2/2013 | Afzali-Ardakani et al. | |
| 8,685,909 B2 | 4/2014 | Angst et al. | |
| 8,754,021 B2 | 6/2014 | Barnes et al. | |
| 2003/0073311 A1 | 4/2003 | Levert et al. | |
| 2004/0050406 A1 * | 3/2004 | Sehgal | 134/26 |
| 2005/0145311 A1 | 7/2005 | Walker et al. | |
| 2006/0063687 A1 | 3/2006 | Minsek et al. | |
| 2006/0073997 A1 * | 4/2006 | Leonte et al. | 510/175 |
| 2006/0148666 A1 | 7/2006 | Peters et al. | |
| 2006/0249482 A1 | 11/2006 | Wrschka et al. | |
| 2007/0010411 A1 * | 1/2007 | Amemiya et al. | 510/175 |
| 2007/0251551 A1 | 11/2007 | Korzenski et al. | |
| 2008/0076688 A1 | 3/2008 | Barnes et al. | |
| 2008/0125342 A1 | 5/2008 | Visintin et al. | |
| 2008/0242574 A1 | 10/2008 | Rath et al. | |
| 2009/0032766 A1 | 2/2009 | Rajaratnam et al. | |
| 2009/0082240 A1 * | 3/2009 | Nukui et al. | 510/176 |
| 2009/0212021 A1 | 8/2009 | Bernhard et al. | |
| 2009/0215269 A1 | 8/2009 | Boggs et al. | |
| 2010/0065530 A1 | 3/2010 | Walker et al. | |
| 2010/0087065 A1 | 4/2010 | Boggs et al. | |
| 2010/0112728 A1 | 5/2010 | Korzenski et al. | |
| 2010/0163788 A1 | 7/2010 | Visintin et al. | |
| 2010/0176082 A1 | 7/2010 | Cooper et al. | |
| 2010/0216315 A1 * | 8/2010 | Yaguchi et al. | 438/745 |
| 2010/0261632 A1 | 10/2010 | Korzenski et al. | |
| 2010/0286014 A1 | 11/2010 | Barnes | |
| 2011/0039747 A1 | 2/2011 | Zhou et al. | |
| 2011/0117751 A1 | 5/2011 | Sonthalia et al. | |
| 2012/0042898 A1 | 2/2012 | Visintin et al. | |
| 2012/0270396 A1 | 10/2012 | Hosomi | |
| 2012/0283163 A1 | 11/2012 | Barnes et al. | |
| 2013/0203643 A1 | 8/2013 | Nakanishi et al. | |
| 2013/0270217 A1 | 10/2013 | Yoshida et al. | |
| 2013/0276284 A1 | 10/2013 | Brosseau et al. | |
| 2013/0280123 A1 | 10/2013 | Chen et al. | |
| 2013/0296214 A1 | 11/2013 | Barnes et al. | |
| 2013/0303420 A1 | 11/2013 | Cooper et al. | |
| 2013/0336857 A1 | 12/2013 | Korzenski et al. | |
| 2014/0038420 A1 | 2/2014 | Chen et al. | |

FOREIGN PATENT DOCUMENTS

| | | |
|---|---|---|
| JP | 10-158869 | 6/1998 |
| JP | 2000286531 A | 10/2000 |
| JP | 2008285720 A | 11/2008 |
| JP | 2008297332 A | 12/2008 |
| JP | 2009120870 A | 6/2009 |
| JP | 2012036750 A | 2/2012 |
| JP | 2012251026 A | 12/2012 |
| KR | 20020016907 A | 3/2002 |
| KR | 20030061461 A | 7/2003 |
| WO | 2006110645 A2 | 10/2006 |
| WO | 2007027522 A2 | 3/2007 |
| WO | 2009073596 A2 | 6/2009 |
| WO | 2010017160 A2 | 2/2010 |
| WO | 2010039936 A2 | 4/2010 |
| WO | 2010086745 A1 | 8/2010 |
| WO | 2010091045 A2 | 8/2010 |
| WO | 2011078335 A1 | 6/2011 |
| WO | 2012097143 A2 | 7/2012 |
| WO | 2012174518 A2 | 12/2012 |
| WO | 2012177620 A2 | 12/2012 |
| WO | 2013138275 A1 | 9/2013 |

OTHER PUBLICATIONS

International Preliminary Report on Patentability dated Apr. 1, 2014.
Denda, Siichi; "TSV Technology for Three-Dimensional Package," Kogyo Chosakai Publishing Co., Ltd, 2009, pp. 12-16.
Japanese Office Action dated Jul. 30, 2015 (and English summary).

* cited by examiner

ETCHING AGENT FOR COPPER OR COPPER ALLOY

CROSS-REFERENCE TO RELATED APPLICATIONS

This application is filed under the provisions of 35 U.S.C. §371 and claims the priority of International Patent Application No. PCT/IB2012/003029 filed on 28 Sep. 2012 entitled "ETCHING AGENT FOR COPPER OF COPPER ALLOY" in the name of Tsutomu KOJIMA, et al., which claims priority to Japanese Patent Application No. 2011-215885, filed on 30 Sep. 2011, both of which are hereby incorporated by reference herein in their entirety.

BACKGROUND OF THE INVENTION

1. Field of the Invention

The present invention relates to an etching solution for etching copper or copper alloy in an electronic substrate, in particular, an etching solution for selectively etching copper or copper alloy in an electronic substrate having an electrode (bump) made of copper or copper alloy and nickel.

2. Description of the Related Art

In order to improve the performance of electronic devices, their elements have been miniaturized or mounted with high density. However, particularly in semiconductor devices, the miniaturization technology is approaching its limits. Devices with a three-dimensional structure have been put to practical use by using conventional wire bonding, flip chip or bump as a technology of mounting elements with high density. However, there is a demand for further increase in the density. Therefore, TSV technology has been being developed, which is a technology of forming a thin via penetrating through silicon and filling such a via with a conductor such as copper to form an electrode (Non-Patent Document 1).

When the copper is used as an electrode in the TSV technology, it is the common practice to make a hole in a silicon substrate, form a barrier metal layer such as silicon oxide film or titanium film on the inner wall of the hole, and then form a copper seed layer by the metal organic chemical vapor deposition or physical vapor deposition (FIG. 1). Then, a protecting film is formed using a resist resin on the copper seed layer except a portion on which an electrode is to be formed (FIG. 2). The portion where no protecting film is formed is filled with a metal such as copper to form a bump. However, since an exposure of copper deteriorates the connection reliability due to causing a surface oxidizing phenomenon, it is the common practice to stack a nickel layer and a solder layer made of an alloy of gold or tin and silver (FIG. 3). Then, the resist resin is removed to form the bump (FIG. 4).

The copper seed layer and the barrier metal layer are formed not only in the hole of the silicon substrate but also on the surface of the silicon substrate. Even after removal of the resist, they still remain. Therefore, they must be removed using an etching solution (FIG. 5).

As a method for wet etching of the copper seed layer, a method using an etching solution consisting of an acid and an oxidizing agent, for example, a mixture of sulfuric acid and hydrogen peroxide is widely used (Patent Document 1). Also, a etching method using an etching solution containing copper chloride or ferric chloride is widely known (Patent Document 2). Further, a etching method using an etching solution composed of sulfuric acid, hydrogen peroxide, and a polyethylene glycol derivative serving as a surfactant is also widely known.

However, in the etching methods as disclosed in Patent Documents 1 to 3, when the copper seed layer formed on the electronic substrate is etched after bump formation, there is a problem of causing a deform of the bump for the reason that a nickel used for the bump formation is etched.

In the existing etching devices, the liquid level of a buffer tank containing a chemical solution is detected and controlled by a sensor and thus generated foam from the etching solution causes the sensor to malfunction. In addition, the etching solution is circulated using a pump and thus the generated foam causes air entrainment of the pump, leading to a problem in the delivery of the etching solution. Therefore, in the etching method as disclosed in Patent Document 3, foam is generated, which disturbs smooth work.

[Non-patent Document 1] "TSV Technology for Three-dimensional Package" (written by Seiichi Denda, published by Kogyo Chosakai Publishing Co., Ltd, 2009), pp. 12 to 16.

[Patent Document 1] Japanese Patent Laid-Open No. 2000-286531

[Patent Document 2] Japanese Patent Laid-Open No. 2008-285720

[Patent Document 3] Japanese Patent Laid-Open No. 2009-120870

SUMMARY OF THE INVENTION

An object of the invention is to provide an etching solution which generates less foam upon use and can etch copper or copper alloy with high selectivity in a step of etching copper or copper alloy in an electronic substrate having both of copper or copper alloy and nickel.

The present inventors studied to achieve the above-mentioned object and achieved the present invention. That is, the invention relates to an etching solution for copper or copper alloy to be used in a step of selectively etching copper or copper alloy in an electronic substrate having both of copper or copper alloy and nickel, wherein the solution comprises, as essential components thereof, (A) a linear alkanolamine, (B) a chelating agent having an acid group in the molecule thereof, and (C) hydrogen peroxide; and also relates to a method of manufacturing an electronic substrate, comprising a step of selectively etching copper or copper alloy in an electronic substrate having both of copper or copper alloy and nickel by using this etching solution.

The present invention makes it possible to etch copper or copper alloy with high selectivity in a step of etching copper or copper alloy in an electronic substrate having both of copper or copper alloy and nickel.

DESCRIPTION OF THE PREFERRED EMBODIMENTS

Figure 1:
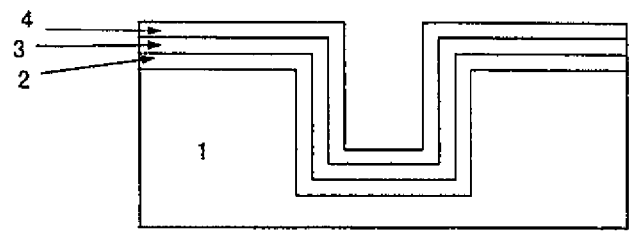
FIG. 1 is a cross-sectional view showing that a layer of a silicon oxide film, a titanium layer, and a copper seed layer are stacked on an inner wall of a hole made in a silicon substrate.
Figure 2:
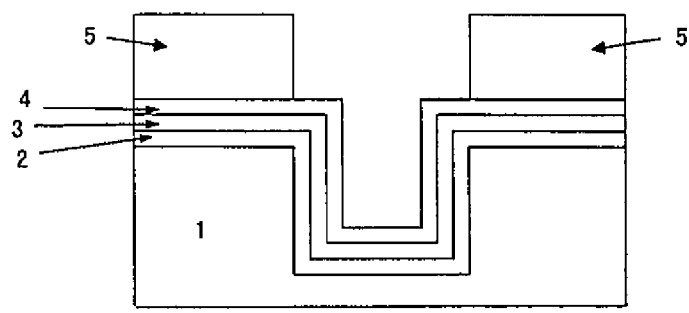
FIG. 2 is a cross-sectional view after a protecting film is formed by applying a resist resin on the silicon substrate of FIG. 1.
Figure 3:
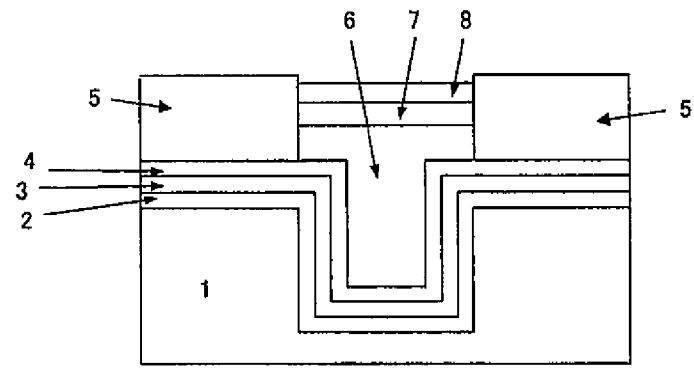
FIG. 3 is a cross-sectional view after metals, that is, nickel and gold are further stacked on the silicon substrate of FIG. 2.

The etching solution for copper or copper alloy according to the invention generates less foam upon use; is used in a step of selectively etching copper or copper alloy in an electronic substrate having both of copper or copper alloy and nickel; and comprises, as essential components, (A) a linear alkanolamine, (B) a chelating agent having an acid group in the molecule thereof, and (C) hydrogen peroxide.

In the present invention, examples of the electronic substrate having both of copper or copper alloy and nickel include those used for semiconductor and flat panel display. Examples of copper include that formed by chemical vapor deposition (CVD), physical vapor deposition (PVD), atomic layer deposition (ALD) or plating. Similarly, examples of the nickel include that formed by the above-described method.

Examples of the linear alkanolamine (A) serving as a first essential component of the etching solution for copper or copper alloy include aliphatic alkanolamines containing a hydroxyl group and one or more nitrogen atoms and free from an alicycle or heterocycle. Specific examples include (A1) a linear alkanolmonoamine represented by the following formula (1) and (A2) a linear alkanolpolyamine (A2) represented by the following formula (2).

[Chemical formula 1]

(1)

wherein, each of $R^1$ to $R^3$ is independently a hydrogen atom or an alkyl group which may be partially substituted with a hydroxyl group, with the proviso that at least one of $R^1$ to $R^3$ is an alkyl group substituted with a hydroxyl group,

[Chemical formula 2]

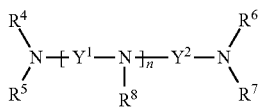

(2)

wherein, each of $R^4$ to $R^8$ is independently a hydrogen atom or an alkyl group which may be partially substituted with a hydroxyl group, with the proviso that at least one of $R^4$ to $R^8$ is an alkyl group substituted with a hydroxyl group; each of $Y^1$ and $Y^2$ is independently an alkylene group having from 1 to 4 carbon atoms; and n is for 0 or an integer from 1 to 4.

In the linear alkanolmonoamine (A1) represented by the formula (1), each of $R^1$ to $R^3$ is a hydrogen atom, an alkyl group, or an alkyl group partially substituted with a hydroxyl group and may be the same or different. At least one of $R^1$ to $R^3$ should be an alkyl group substituted with a hydroxyl group.

Examples of the alkyl group include linear or branched ones having from 1 to 5 carbon atoms. Specific examples include a methyl group, an ethyl group, an n-propyl group, an isopropyl group, an n-butyl group, an isobutyl group, a sec-butyl group, a tert-butyl group, an n-pentyl group, an isopentyl group, and a tert-pentyl group.

Examples of the alkyl group partially substituted with a hydroxyl group include linear or branched ones having from 1 to 5 carbon atoms.

Examples of the alkyl group partially substituted with a hydroxyl group include a hydroxymethyl group, a 1-hydroxyethyl group, a 2-hydroxyethyl group, a 1-hydroxypropyl group, a 2-hydroxypropyl group, a 3-hydroxypropyl group, a 1-hydroxyisopropyl group, a 2-hydroxyisopropyl group, a dihydroxymethyl group, a 1,1-dihydroxyethyl group, a 1,2-dihydroxyethyl group, a 2,3-dihydroxypropyl group, and a 1,2,3-trihydroxypropyl group.

In the lenear alkanolpolyamine (A2) represented by the formula (2), each of $R^4$ to $R^8$ is a hydrogen atom, an alkyl group, or an alkyl group partially substituted with a hydroxyl group and may be the same or different, with the proviso that at least one of $R^4$ to $R^8$ should be an alkyl group substituted with a hydroxyl group.

The alkyl group and the alkyl group partially substituted with a hydroxyl group are similar to the above-described alkyl group and alkyl group partially substituted with a hydroxyl group represented by $R^1$ to $R^3$, respectively.

Examples of the alkylene group represented by $Y^1$ or $Y^2$ in the formula (2) include linear or branched alkylene groups having from 1 to 4 carbon atoms.

Specific examples include a methylene group, an ethylene group, a propylene group, a tetramethylene group, a butylene group, a 2,2-dimethylpropylene group, and a 2-ethylpropylene group. The number of carbon atoms of the alkylene group represented by $Y^1$ or $Y^2$ is preferably from 1 to 4, more preferably from 1 to 3, particularly preferably 2 from the standpoint of suppressing foaming of the etching solution.

In the formula (2), n is 0 or an integer of from 1 to 4, preferably 0, 1, or 2. The n $[-Y^1-N(-R^8)-]$ may be the same or different.

The linear alkanolamine (A) represented by the formula (1) or (2) preferably has the HLB of from 12 to 45 from the standpoint of suppressing foaming of the etching solution.

The "HLB" as used herein indicates a value showing a hydrophile-lipophile balance, and is known as a value calculated, for example, based on the Oda method described on page 212, "KAIMEN KASSEIZAI NYUMON" (published in 2007 by Sanyo Chemical Industries, Ltd., written by Takehiko FUJIMOTO). It is not a value calculated based on the Griffin method.

The HLB value can be calculated from an inorganic value/an organic value ratio of an organic compound.

HLB≈10×(inorganic/organic)

The organic value and the inorganic value from which the HLB value is derived can be calculated using values in the table described on page 213 of the above-mentioned "KAIMEN KASSEIZAI NYUMON".

Examples of the lenear alkanolmonoamine (A1) include monoethanolamine, 2-(methylamino)ethanol, 2-(ethylamino)ethanol, 2-(isopropylamino)ethanol, 2-amino-2-methyl-1-propanol, 2-(dimethylamino)ethanol, 2-(diethylamino)ethanol, diethanolamine, triethanolamine, 3-amino-1-propanol, 1-amino-2-propanol, diisopropanolamine, triisopropanolamine, and 3-(diethylamino)-1-propanol.

Examples of the lenear alkanolpolyamine (A2) include 2-[(2-aminoethyl)amino]ethanol, 2-[methyl[2-(dimethylamino)ethyl]amino]ethanol, 2,2'-(ethylenebisimino) bisethanol, N-(2-hydroxyethyl)-N'-(2-aminoethyl)ethylenediamine, N-(3-hydroxypropyl)ethylenediamine, 2,2'-(2-aminoethylimino)diethanol, N-(2-hydroxyethyl)-N'-(2-aminoethyl)ethylenediamine, 2-[bis(2-aminoethyl)amino] ethanol, 1-[2-[(2-aminoethyl)amino]ethyl]amino-2-propanol, 3,3',3'',3'''-[3-hydroxypropyliminobis(ethylenenitrilo)]tetrakis(1-propanol), N,N,N',N'-tetrakis(2-hydroxyethyl)ethylenediamine, N,N,N',N',N''-pentakis(2-hydroxypropyl)diethylenetriamine, N,N,N',N'-tetrakis(2-hydroxyethyl)trimethylenediamine, N,N-bis(hydroxyethyl) diethylenetriamine, N1,N4-bis(hydroxyethyl) diethylenetriamine, N,N,N',N',N''-pentakis(2- hydroxypropyl)diethylenetriamine, N1-(2-hydroxypropyl)triethylenetetramine, N4-(2-hydroxypropyl)triethylenetetramine, and N-(2-hydroxypropyl)triethylenetetramine.

The etching agent of the invention may be used after diluted with water if necessary, but the content of the linear alkanolamine (A) is preferably from 0.05 to 6 wt %, more preferably from 0.1 to 3 wt %, especially preferably from 0.2 to 1.5 wt % based on the total weight of the etching solution upon use, from the standpoint of the ratio of the etching rate of nickel/copper or copper alloy.

The chelating agent (B) having an acid group in the molecule thereof and serving as a second essential component of the invention is effective for increasing an etching rate of copper or copper alloy.

The chelating agent (B) of the invention having an acid group in the molecule thereof has two or more functional groups for having a chelating effect. So long as one or more of the functional groups is an acid group, the other functional group may be an alcoholic hydroxyl group, a phenolic hydroxyl group, a nitrile group, a thiol group, an amino group, or the like.

Examples of the acid group in the chelating agent (B) used in the invention include a carboxyl group, a phosphoric acid group, a sulfonic acid group, a phosphonic acid group, a sulfuric acid group, a nitric acid group, and a boric acid group.

The chelating agent (B) may be contained in a salt form in the etching solution.

Examples of the chelating agent (B) of the invention or salt thereof include organic acids containing two or more carboxyl groups as the acid group or salts thereof (B1); organic acids containing two or more phosphonic acid groups as the acid group or salts thereof (B2); organic acids containing two or more sulfonic acid groups as the acid group or salts thereof (B3); and organic acids containing one or more carboxyl groups and one or more phosphonic acid groups as the acid group or salts thereof (B4).

As the chelating agent having an acid group in the molecule thereof (B) may be a chelating agent containing only one of a carboxyl group, a phosphonic acid group, and a sulfonic acid group as the acid group (B5), insofar as it contains, in the molecule thereof, a hydroxyl group showing a chelating effect.

Examples of the organic acid containing two or more carboxyl groups as the acid group or salts thereof (B1) include ethylenediaminetetraacetic acid (salts), diethylenetriaminepentaacetic acid (salts), triethylenetetraminehexaacetic acid (salts), hydroxyethylethylenediaminetriacetic acid (salts), dihydroxyethylethylenediaminetetraacetic acid (salts), nitriloacetic acid (salts), hydroxyethyliminodiacetic acid (salts), β-alaninediacetic acid (salts), aspartic diacetic acid (salts), methylglycinediacetic acid (salts), iminodisuccinic acid (salts), serinediacetic acid (salts), hydroxyiminodisuccinic acid (salts), tartaric acid (salts), citric acid (salts), pyromellitic acid (salts), benzopolycarboxylic acid (salts), and cyclopentanetetracarboxylic acid (salts).

Examples of the organic acid containing two or more phosphonic acid groups as the acid group or salts thereof (B2) include methyldiphosphonic acid (salts), aminotri(methylenephosphonic acid) (salts), 1-hydroxyethylidene-1,1-diphosphonic acid (salts), ethylenediaminetetra(methylenephosphonic acid) (salts), hexamethylenediaminetetra(methylenephosphonic acid) (salts), propylenediaminetetra(methylenephosphonic acid) (salts), diethylenetriaminepenta(methylenephosphonic acid) (salts), triethylenetetraminehexa(methylenephosphonic acid) (salts), triaminotriethylaminehexa(methylenephosphonic acid) (salts), trans-1,2-cyclohexanediaminetetra(methylenephosphonic acid) (salts), glycoletherdiaminetetra(methylenephosphonic acid) (salts), and tetraethylenepentaminehepta(methylenephosphonic acid) (salts).

Examples of the organic acid containing two or more sulfonic acid groups as the acid group or salts thereof (B3) include methanedisulfonic acid (salts), ethanedisulfonic acid (salts), phenoldisulfonic acid (salts), naphthalenedisulfonic acid (salts), and piperazine-1,4-bis(2-ethanesulfonic acid) (salts).

Examples of the organic acid containing one or more carboxyl groups and one or more phosphonic acid groups as the acid group or salts thereof (B4) include phosphonoacetic acid (salts), 2-hydroxy-2-phosphonoacetic acid (salts), carboxyphosphonic acid (salts), 3-phosphonopropionic acid (salts), and 4-(3-phosphonopropyl)-2-piperazinecarboxylic acid (salts).

Examples of the chelating agent containing a hydroxyl group and, as an acid group, only one of a carboxyl group, a phosphonic acid group and a sulfonic acid group (B5) include lactic acid (salts), salicylic acid (salts), gallic acid (salts), 2-hydroxyethylphosphonic acid (salts), and 2-hydroxyethanesulfonic acid (salts).

Among the chelating agents (B) of the invention, the above-mentioned (B1), (B2), and (B3) are preferred, with (B2) being more preferred, from the standpoint of the etching rate of copper or copper alloy.

The chelating agents (B) having an acid group in the molecule thereof may be used alone or in combination.

The content of the chelating agent (B) having an acid group in the molecule thereof is preferably from 0.1 to 50 wt %, more preferably from 0.5 to 30 wt %, particularly preferably from 1 to 20 wt % based on the total weight of the etching solution upon use from the standpoint of the etching rate of copper or copper alloy.

Hydrogen peroxide (C) which is the third essential component of the invention is effective for increasing the etching rate. An aqueous solution of hydrogen peroxide may be used as hydrogen peroxide (C).

The content of hydrogen peroxide (C) is, in terms of purity content, preferably from 0.05 to 20 wt %, more preferably from 0.1 to 10 wt. %, particularly preferably from 0.2 to 5 wt % based on the total weight of the etching solution upon use from the standpoint of an etching rate.

The weight ratio (B)/(A) of the chelating agent (B) having an acid group in the molecule thereof to the linear alkanolamine (A) in the invention is generally from 1 to 100, preferably from 2 to 50, more preferably from 5 to 30 from the standpoint of the ratio of the etching rate of nickel to copper or copper alloy and an suppression of foaming.

The weight ratio of the chelating agent (B) having an acid group in the molecule thereof to the hydrogen peroxide (C), that is, (B)/(C), in the invention is generally from 1 to 30, preferably from 2 to 20, more preferably from 3 to 10 from the standpoint of the etching rate of copper or copper alloy.

In the etching solution of the invention, it is preferred to use a mixture of the components (A), (B), and (C) and if necessary a solvent. Examples of the solvent include water, alcohols, glycol ethers, ethers, esters, ketones, carbonates, and amides.

As the solvent of the etching solution, water is preferred from the standpoint of an easy-handling.

The etching solution of the invention may contain an anticorrosive such as a triazole, an imidazole, a thiol compound, or a sugar alcohol if necessary in order to protect a wiring metal.

The etching solution of the invention may contain an antioxidant if necessary in order to protect a wiring metal.

Examples of the antioxidant include phenols such as catechin, tocopherol, catechol, methyl catechol, ethyl catechol, tert-butyl catechol, gallic acid, methyl gallate, and propyl gallate, 3-hydroxyflavone, and ascorbic acid.

The etching solution of the invention may contain a basic compound or an acidic compound for the purpose of pH control.

Examples of the basic compound to be added for the above-described purpose include ammonia, amines, tetraalkylammonium hydroxides, and nitrogen-containing heterocyclic compounds. Examples of the amines include aliphatic amines, alkylenediamines, polyalkylenepolyamines, aromatic amines, alicyclic amines, and guanidine.

Examples of the acidic compound to be added for the above-described purpose include inorganic acids such as sulfuric acid, hydrochloric acid, nitric acid, and hydrofluoric acid, and organic acids such as acetic acid.

For the purpose of stabilizing the etching rate, it is effective to add an inorganic acid or salt thereof. Such an inorganic acid is preferably sulfuric acid, hydrochloric acid, nitric acid, or hydrofluoric acid.

The etching solution of the invention is generally used under temperature conditions of from 10° C. to 100° C., preferably from 20° C. to 80° C. Temperatures of 10° C. or greater are preferred from the standpoint of the etching rate, while a temperature not greater than 100° C. is preferred from the standpoint of causing no scatter in the etching rate.

EXAMPLES

The invention will hereinafter be described in further detail by Examples and Comparative Examples, which does not limit the present invention. Unless otherwise specifically indicated, % means wt % and "part" or "parts" mean "part or parts by weight".

Examples 1 to 7 and Comparative Examples 1 to 6

The linear alkanolamine (A), the chelating agent (B having an acid group in the molecule thereof), the hydrogen peroxide (C), and water listed in Table 1 were mixed in a vessel made of polypropylene to obtain etching solutions of the invention and etching solutions for comparison.

TABLE 1

| | | | Examples | | | | | | | Comparative Examples | | | | | |
|---|---|---|---|---|---|---|---|---|---|---|---|---|---|---|---|
| | | | 1 | 2 | 3 | 4 | 5 | 6 | 7 | 1 | 2 | 3 | 4 | 5 | 6 |
| Amount (parts by weight) | Linear alkanol- amine (A) | Triethanolamine (A-1) | 1.0 | | | 0.2 | | 0.5 | 0.5 | 1.0 | 1.0 | | | 1.0 | 1.0 |
| | | 2-[(2-Aminoethyl) amino]ethanol (A-2) | | 1.0 | | | 0.5 | | | | | | | | |
| | | 1,2-Bis[di(hydroxyethyl) amino]ethane (A-3) | | | 0.5 | | | 0.5 | | | | | | | |
| | | Lauryl alcohol EO (9 mol) adduct (A'-1) | | | | | | | | | | | 1.0 | | |
| | Chelating agent (B) having an acid group | Citric acid (B-1) | 10.0 | | | | | | | 10.0 | | 10.0 | 10.0 | | |
| | | 60% Aq. solution of 1-hy- droxy-ethylidene-1,1- diphosphonic acid (B-2) | | 16.7 | | | 6.7 | 6.7 | 6.7 | | | | | | |
| | | 1,2-Ethanedisulfonic acid dehydrate (B-3) | | | 10.0 | | | | | | | | | | |
| | | Nitrilotrismethylenephos- phonic acid (B-4) | | | | 4.0 | | | | | | | | | |
| | | Ethylenediamine (B'-1) | | | | | | | | | | | | 10.0 | |
| | Hydrogen peroxide (C) | 35% Aqueous hydrogen peroxide (C-1) | 8.6 | 2.9 | 8.6 | 1.5 | 2.9 | 2.9 | 0.6 | | 8.6 | 8.6 | 8.6 | 8.6 | 8.6 |
| | | Sulfuric acid | | | | 0.1 | | | | | | | | | 10.0 |
| | | Water | 80.4 | 79.4 | 80.9 | 94.2 | 89.9 | 89.9 | 91.7 | 89.0 | 90.4 | 81.4 | 80.4 | 80.4 | 80.4 |
| | | Weight ratio (B)/(A) | 10.0 | 16.7 | 20.0 | 20.0 | 13.4 | 13.4 | 6.7 | — | — | — | — | — | — |
| | | Weight ratio (B)/(C) | 3.3 | 10.0 | 3.3 | 8.0 | 4.0 | 4.0 | 20.0 | — | — | — | — | — | — |
| Perform- ance evaluation | | Antifoaming property | ○ | ○ | ○ | ○ | ○ | ○ | ○ | ○ | ○ | ○ | X | ○ | ○ |
| | | Etching time of copper (min) | 1 | 3 | 1 | 10 | 5 | 5 | 3 | >60 | >60 | 1 | 1 | >60 | 1 |
| | | Etching amount of nickel | ○ | ○ | ○ | ○ | ○ | ○ | ○ | ○ | ○ | X | ○ | ○ | X |
| | | Nickel/copper etching rate ratio | ○ | ○ | ○ | ○ | ○ | ○ | ○ | X | X | X | ○ | X | X |

The etching solution of the invention may contain an antifoaming agent if necessary in order to protect a wiring metal.

Examples of the antifoaming agent include silicone antifoaming agents, long-chain alcohol antifoaming agents, fatty acid ester antifoaming agents, and metallic soap antifoaming agents. Ethylene oxide-propylene oxide copolymers may also be used as the antifoaming agent.

Electronic substrates can be produced via a step of selectively etching copper or copper alloy in electronic substrates having both of copper or copper alloy and nickel using the etching solution of the invention.

Examples of the method of etching copper or copper alloy in the invention include immersion wet-etching and single-wafer etching.

Incidentally, symbols in the above table mean the following compounds.
(A-1): Triethanolamine
(A-2): 2-[(2-Aminoethyl)amino]ethanol
(A-3): 1,2-Bis[di(hydroxyethyl)amino]ethane ("SANNIX NE-240" from Sanyo Chemical Industries, Ltd.)
(A'-1): Lauryl alcohol EO (9 mol) adduct
(B-1): Citric acid
(B-2): Aqueous solution containing 60% 1-hydroxyethylidene-1,1-diphosphonic acid
(B-3): 1,2-Ethanedisulfonic acid dihydrate
(B-4): Nitrilotrismethylenephosphonic acid
(B'-1): Ethylenediamine
(C-1): Aqueous containing 35% hydrogen peroxide In order to evaluate the performances of the etching solutions, an antifoaming property, etching time of copper, and etching performance of nickel (ratio of nickel/copper etching rate) were evaluated using the following methods, respectively.

<Antifoaming Property>

The antifoaming property can be measured according to the Ross Miles test [JIS K3362 (1998)]. By a test using an apparatus specified in this JIS and an etching solution prepared using ultrapure water as a test solution, the height (mm) of foam immediately after the whole test solution was caused to flow out was measured visually and the antifoaming property was evaluated based on the following evaluation criteria.
○: less than 50 mm
×: 50 mm or greater <Etching Time of Copper>

The etching time of copper was evaluated as the time (minute) until the luster of the copper seed layer is disappeared by using the following operation method.

Figure 4:
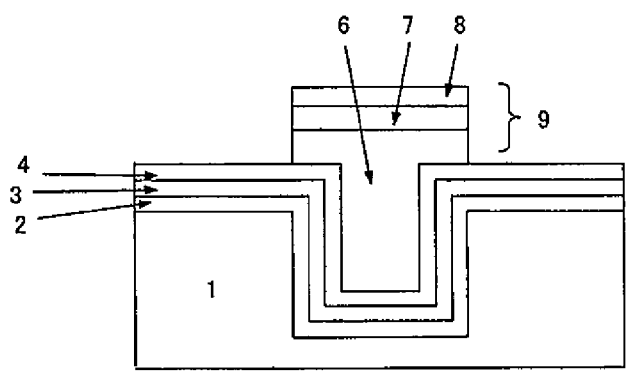
FIG. 4 is a cross-sectional view after removal of the resist resin from the silicon substrate of FIG. 3.

(1) A test piece was prepared by processing a silicon substrate to obtain a wafer (thickness of copper seed layer: 1 μm) as shown in FIG. 4, which is then cut it into a 15-mm square.

When the cross-section of the test piece cut into 1-cm square was observed using a scanning electron microscope ("S-4800" from Hitachi Hi-Technologies Corporation), the bump had a width of about 30 μm and a height of about 8 μm. The copper seed layer had a thickness of 1 μm.

(2) The etching solution was poured in a vessel made of polypropylene. The test piece prepared above was immersed in the vessel, followed by stirring with a magnetic stirrer.

Figure 5:
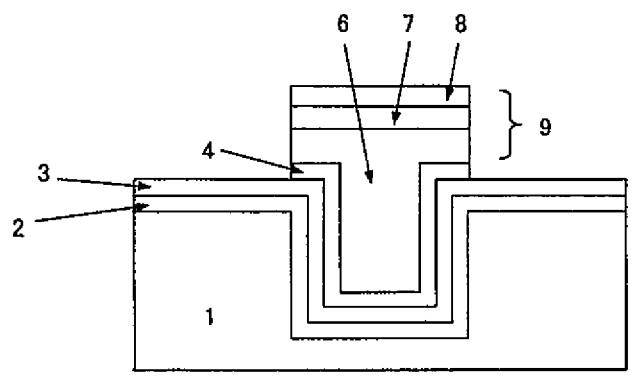
FIG. 5 is a cross-sectional view after removal of the copper seed layer from the silicon substrate of FIG. 4.
Figure 6:
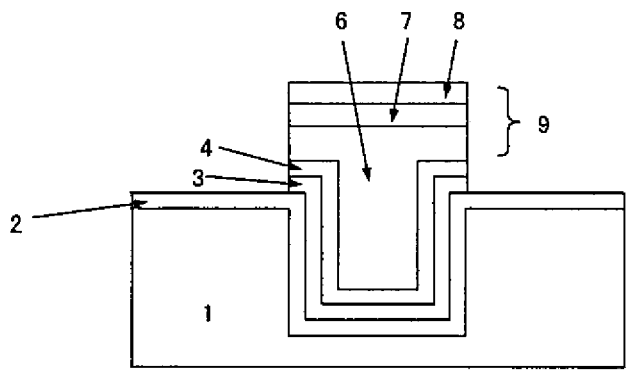
FIG. 6 is a cross-sectional view after removal of a barrier metal (titanium) layer from the silicon substrate of FIG. 5.

(3) The surface of the test piece was visually observed while immersing it in the etching solution under stirring; and the time until the luster of copper on the entire surface of the copper seed layer was disappeared (i.e. until the entire surface of the titanium layer could be observed; FIG. 5(3)) was measured.

In the etching solution used for the above purpose, the time until the copper luster is disappeared is preferably within 10 minutes.

In the case where the test piece from which luster did not disappear by immersion for 60 minutes, immersion was stopped at 60 minutes and it was indicated in Table 1 as ">60".

<The Amount of Etching Nickel, and the Ratio of Nickel/Copper Etching Rate>

The amount of etching nickel, and the ratio of nickel/copper etching rate were measured and evaluated using the following operation method.

(1) A test piece was prepared by processing a silicon substrate to obtain a wafer (thickness of copper seed layer: 1 μm) as shown in FIG. 4, which was then cut into a 15-mm square.

(2) The etching solution was poured in a vessel made of polypropylene. The test piece prepared above was immersed in the vessel for 1 minute, followed by stirring with a magnetic stirrer. Then, the test piece was taken out.

(3) By using a scanning electron microscope ("S-4800" from Hitachi Hi-Technologies Corporation), the picture of the side surface of the test piece was taken in order to confirm the degree and the width of a corrosion of the nickel layer in the test piece before immersion and after immersion, respectively. From the photographic images, the width $A_1$ (μm) of the nickel layer (7 of FIG. 4) in the test piece before immersion and the width $A_2$ (μM) of the nickel layer (7 of FIG. 5) in the test piece after immersion were measured.

(4) As the amount of etching nickel, a change (difference) $\Delta A_{Ni}$ of the width of the nickel layer in the test piece before and after immersion was calculated according to the following equation (1).

[Equation 1]

$$\Delta A_{Ni} \text{ (μm)} = (\text{width } A_1 \text{ of nickel layer in test piece before immersion}) - (\text{width } A_2 \text{ of nickel layer in test piece after immersion}) \quad (1)$$

Evaluation is made based on the following evaluation criteria:
○: less than 1 μm
×: 1 μm or greater (5) The ratio of nickel/copper etching rate was calculated by incorporating two values which are read and the etching time of copper into the following equation (2).

[Equation 2]

$$\text{Nickel/copper etching rate ratio} = \frac{\Delta A_{Ni} \times T_{Cu}}{T_{Ni} \times A_{Cu}} = \Delta A_{Ni} \times T_{Cu} \quad (2)$$

$T_{Cu}$: Etching time of copper (min)
$T_{Ni}$: Etching time of nickel, which is one minute in the present evaluation method
$A_{Cu}$: Thickness of the copper seed layer and 1 μm in the present evaluation method For the ratio of nickel/copper etching rate which is calculated according to the equation (2), the evaluation was made based on the following evaluation criteria.
○: less than 0.5
×: 0.5 or greater As is apparent from Table 1, in Examples 1 to 7, there was no problem in foaming and the etching rate of the copper seed layer was high, but the etching of the nickel portion was not observed, showing that the copper seed layer was etched with high selectivity.

Neither the copper seed layer nor nickel was etched in Comparative Example 1 containing no aqueous hydrogen peroxide and Comparative Example 2 having an acid group in the molecule thereof and containing no chelating agent.

In Comparative Example 2 containing no linear alkanolamine, the etching rate of the copper seed layer was high, but nickel was etched, and thus the copper seed layer could not be etched with high selectivity. In Comparative Example 4 in which a lauryl alcohol EO (9 mol) adduct (A'-1) was used instead of the linear alkanolamine (A), the copper seed layer was etched with high selectivity, but much foaming was generated.

In the Comparative Example 5 using the chelating agent (B'-1) having no acid group in the molecule thereof, the copper seed layer was etched at a low rate.

In the Comparative Example 6 containing sulfuric acid instead of the chelating agent, nickel was etched.

When used for products containing both of copper or copper alloy and nickel, the etching solution for copper or copper alloy according to the invention generates less foam upon use and can etch copper or copper alloy with high selectivity so that it is useful as a chemical used in manufacturing steps of electronic substrates such as printed wiring board, flat panel display, MEMS, and semiconductor device.

DESCRIPTION OF REFERENCE NUMERALS

Numbers 1 to 9 in FIGS. 1 to 6 show the following members.
1: Silicon substrate
2: Silicon oxide film
3: Titanium layer
4: Copper seed layer 5: Resist resin
6: Copper plated layer
7: Nickel plated layer
8: Gold plated layer
9: Bump

What is claimed is:

1. An etching solution for copper or copper alloy to be used in a step of selectively etching copper or copper alloy in an electronic substrate having both of copper or copper alloy and nickel, said etching solution comprising (A) a linear alkanolamine, (B) a chelating agent having an acid group in the molecule thereof, and (C) hydrogen peroxide, wherein a weight ratio of the chelating agent (B) to the linear alkanolamine (A),((B)/(A)) is from 1 to 100.

2. The etching solution according to claim 1, wherein the linear alkanolamine (A) is a linear alkanolmonoamine (A1) represented by the following formula (1) or a linear alkanolpolyamine (A2) represented by the following formula (2):

[Chemical formula 1]

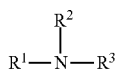

(1)

wherein, each of $R^1$ to $R^3$ is independently a hydrogen atom or an alkyl group which may be partially substituted with a hydroxyl group, with the proviso that at least one of $R^1$ to $R^3$ is an alkyl group substituted with a hydroxyl group:

[Chemical formula 2]

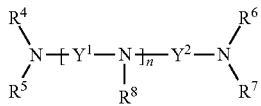

(2)

wherein, each of $R^4$ to $R^8$ is independently a hydrogen atom or an alkyl group which may be partially substituted with a hydroxyl group, with the proviso that at least one of $R^4$ to $R^8$ is an alkyl group substituted with a hydroxyl group; each of $Y^1$ and $Y^2$ is independently an alkylene group having from 1 to 4 carbon atoms; and n is 0 or an integer from 1 to 4.

3. The etching solution according to claim 1, wherein the linear alkanolamine (A) has an HLB of from 12 to 45.

4. The etching solution according to claim 1, wherein the chelating agent (B) is an organic acid having two or more phosphonic acid groups and/or sulfonic acid groups in total in the molecule thereof.

5. The etching solution according to claim 1, wherein the chelating agent (B) is an organic acid having two or more carboxyl groups in the molecule thereof.

6. The etching solution according to claim 1, wherein a weight ratio of the chelating agent (B) to the linear alkanolamine (A), ((B)/(A)) is from 2 to 50.

7. The etching solution according to claim 1, wherein a weight ratio of the chelating agent (B) to the hydrogen peroxide (C), ((B)/(C)) is from 1 to 30.

8. The etching solution according to claim 1, wherein the linear alkanolamine (A) comprises a species selected from the group consisting of monoethanolamine, 2-(methylamino)ethanol, 2-(ethylamino)ethanol, 2-(isopropylamino)ethanol, 2-amino-2-methyl-1-propanol, 2-(dimethylamino)ethanol, 2-(diethylamino)ethanol, diethanolamine, triethanolamine, 3-amino-1-propanol, 1-amino-2-propanol, diisopropanolamine, triisopropanolamine, and 3-(diethylamino)-1-propanol.

9. The etching solution according to claim 1, wherein the linear alkanolpolyamine (B) comprises a species selected from the group consisting of 2-[(2-aminoethyl)amino]ethanol, 2-[methyl[2-(dimethylamino)ethyl]amino]ethanol, 2,2'-(ethylenebisimino)bisethanol, N-(2-hydroxyethyl)-N'-(2-amino ethyl)ethylenediamine, N-(3-hydroxypropyl)ethylenediamine, 2,2'-(2-aminoethylimino)diethanol, N-(2-hydroxyethyl)-N'-(2-aminoethyl)ethylenediamine, 2-[bis(2-aminoethyl)amino]ethanol, 1[2-[(2-aminoethyl)amino]ethyl]amino-2-propanol, 3,3',3'',3'''-[3-hydroxypropyliminobis(ethylenenitrilo)]tetrakis(1-propanol), N,N,N',N'-tetrakis(2-hydroxyethyl)ethylenediamine, N,N,N',N',N''-pentakis(2-hydroxypropyl)diethylenetriamine, N,N,N',N'-tetrakis(2-hydroxyethyl)trimethylenediamine, N,N-bis(hydroxyethyl)diethylenetriamine, N1,N4-bis(hydroxyethyl)diethylenetriamine, N,N,N',N',N''-pentakis(2-hydroxypropyl)diethylenetriamine, N1-(2-hydroxypropyl)triethylenetetramine, N4-(2-hydroxypropyl)triethylenetetramine, and N-(2-hydroxypropyl)triethylenetetramine.

10. The etching solution according to claim 4, wherein the chelating agent (B) is an organic acid having two or more phosphonic acid groups and is selected from the group consisting of methyldiphosphonic acid (salts), aminotri(methylenephosphonic acid) (salts), 1-hydroxyethylidene-1,1-diphosphonic acid (salts), ethylenediaminetetra(methylenephosphonic acid) (salts), hexamethylenediaminetetra(methylenephosphonic acid) (salts), propylenediaminetetra(methylenephosphonic acid) (salts), diethylenetriaminepenta(methylenephosphonic acid) (salts), triethylenetetraminehexa(methylenephosphonic acid) (salts), triaminotriethylaminehexa(methylenephosphonic acid) (salts), trans-1,2-cyclohexanediaminetetra(methylenephosphonic acid) (salts), glycoletherdiaminetetra(methylenephosphonic acid) (salts), and tetraethylenepentaminehepta(methylenephosphonic acid) (salts).

11. The etching solution according to claim 4, wherein the chelating agent (B) is an organic acid having two or more sulfonic acid groups and is selected from the group consisting of methanedisulfonic acid (salts), ethanedisulfonic acid (salts), phenoldisulfonic acid (salts), naphthalenedisulfonic acid (salts), and piperazine-1,4-bis(2-ethanesulfonic acid) (salts).

12. The etching solution according to claim 5, wherein the chelating agent (B) is an organic acid having two or more carboxyl groups are is selected from the group consisting of ethylenediaminetetraacetic acid (salts), diethylenetriaminepentaacetic acid (salts), triethylenetetraminehexaacetic acid (salts), hydroxyethylethylenediaminetriacetic acid (salts), dihydroxyethylethylenediaminetetraacetic acid (salts), nitriloacetic acid (salts), hydroxyethyliminodiacetic acid (salts), β-alaninediacetic acid (salts), aspartic diacetic acid (salts), methylglycinediacetic acid (salts), iminodisuccinic acid (salts), serinediacetic acid (salts), hydroxyiminodisuccinic acid (salts), tartaric acid (salts), citric acid (salts), pyromellitic acid (salts), benzopolycarboxylic acid (salts), and cyclopentanetetracarboxylic acid (salts).

13. The etching solution according to claim 1, further comprising a solvent.

14. The etching solution of claim 13, wherein the solvent comprises a species selected from the group consisting of water, alcohols, glycol ethers, ethers, esters, ketones, carbonates, and amides.

15. The etching solution according to claim 1, further comprising an additional species selected from the group consisting of an anticorrosive, an antioxidant, a basic compound for pH control, an acidic compound for pH control, an inorganic acid, and an antifoaming agent.

16. A method of manufacturing an electronic substrate, comprising a step of using the etching solution for copper or copper alloy as claimed in claim 1 to selectively etch copper or copper alloy in an electronic substrate having both of copper or copper alloy and nickel.

17. The etching solution according to claim 1, wherein the amount of the linear alkanolamine (A) is 0.1 to 3 wt %, based on the total weight of the etching solution upon use.

* * * * *